United States Patent [19]
Cho et al.

[11] Patent Number: 5,058,073
[45] Date of Patent: Oct. 15, 1991

[54] CMOS RAM HAVING A COMPLEMENTARY CHANNEL SENSE AMPLIFIER

[75] Inventors: Shizuo Cho; Masaru Uesugi, both of Tokyo, Japan

[73] Assignee: Oki Electric Industry Co., Ltd., Japan

[21] Appl. No.: 608,035

[22] Filed: Oct. 30, 1990

Related U.S. Application Data

[63] Continuation of Ser. No. 318,234, Mar. 3, 1989, abandoned.

[30] Foreign Application Priority Data

Mar. 10, 1988 [JP] Japan .................................. 63-56930

[51] Int. Cl.$^5$ ................................................. G11C 7/00
[52] U.S. Cl. ..................................... 365/205; 365/190; 365/203
[58] Field of Search ............. 365/205, 189.05, 230.03, 365/190, 203; 307/530

[56] References Cited

U.S. PATENT DOCUMENTS

| Re. 32,682 | 5/1988 | Eaton et al. | 365/189.05 |
|---|---|---|---|
| 4,618,947 | 10/1986 | Tran et al. | 365/236 |
| 4,710,901 | 12/1987 | Kumanoya et al. | 365/205 |
| 4,829,483 | 5/1989 | Ogihara | 365/190 |
| 4,931,992 | 6/1990 | Ogihara et al. | 365/190 |

OTHER PUBLICATIONS

IEEE 1985; "FAM 17.2: A 90ns 1Mb DRAM with Multi-Bit Test Mode"; pp. 240, 241, Masaki Kumanoya, Kazuyasu Fujishima, Katsuhiro Tsukamoto, Yasumasa Nishimura.

Primary Examiner—Terrell W. Fears
Assistant Examiner—Jack A. Lane
Attorney, Agent, or Firm—Edward D. Manzo

[57] ABSTRACT

A semiconductor memory such as a dynamic RAM (Random Access Memory) implemented by complementary MOS (CMOS) transistors includes a plurality of bit line pairs each constituted by a first and a second complementary bit line for transferring data, and a plurality of word lines extending across the bit line pairs. A plurality of memory cells are located at the intersecting points of the bit line pairs and word lines and connected to the latter for storing data therein. A plurality of sense amplifier circuits are each associated with respect to one of the bit line pairs for sensing potentials on a first and a second node associated with the bit line pair and amplifying the sensed potentials. Each of the sense amplifier circuits includes a first and a second sense amplifier of opposite polarity. A plurality of first field effect transistors (FETs) each has a source-drain path for connecting to the first node the first bit line of respective one of the bit line pairs. A plurality of second FETs each has a source-drain path for connecting to the second node the second bit line of respective one of the bit line pairs. The plurality of first and second field effect transistors individually have commonly connected control electrodes to which a gate signal is applied. The plurality of first and second field effect transistors are complementarily controlled in response to the gate signal to transfer one of the potentials on the first and second bit lines to one of the first and second sense amplifiers.

7 Claims, 5 Drawing Sheets

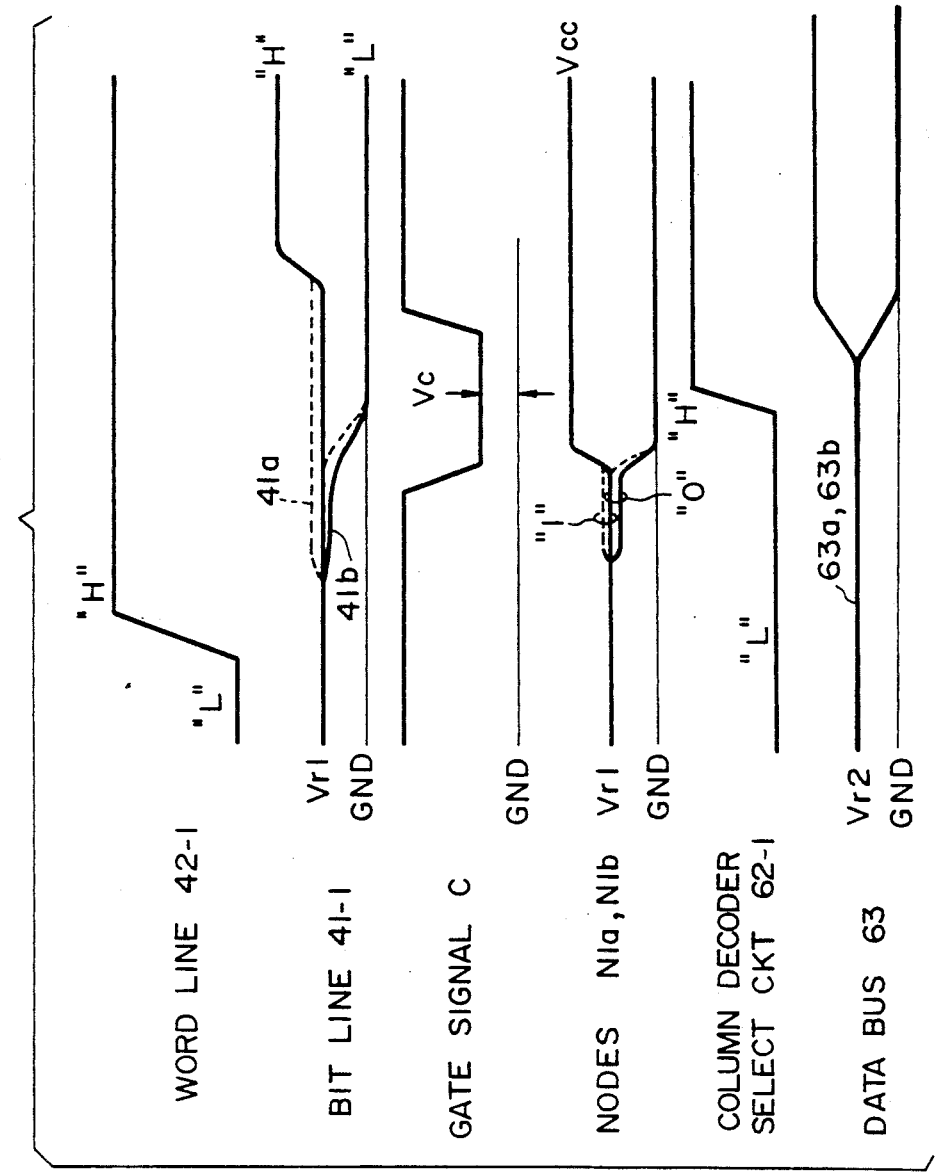

CMOS RAM HAVING A COMPLEMENTARY CHANNEL SENSE AMPLIFIER

This is a continuation of copending application Ser. No. 07/318,234 filed on Mar. 3, 1989 now abandoned.

BACKGROUND OF THE INVENTION

1. Field of the Invention

The present invention relates to a dynamic RAM (Random Access Memory) or similar semiconductor memory which is implemented by complementary MOS (CMOS) transistors. More particularly, the present invention is concerned with the sense circuit configuration of a sense amplifier which is built in such a semiconductor memory.

2. Description of the Prior Art

In the semiconductor memories art, various achievements have been reported including "FAM 17.2: A 90 ns 1 Mb DRAM with Multi-Bit Test Mode" by Kumanoya et al, Digest of Technical Papers (1985-2-15), IEEE International Solid State Circuit Conference (U.S.A), pp. 240–241. As shown in FIG. 2, a semiconductor memory disclosed in this paper has a dynamic RAM configuration adopting a shared sense amplifier system.

As shown in a left part of FIG. 2, the dynamic RAM includes a plurality of bit line pairs 10 for sending data and each having two complementary bit lines 10a and 10b, and a plurality of word lines 11. Memory cells 12 are individually connected to the bit line pairs 10 and word lines 11 so as to store data therein. The word lines 11 are adapted to select any of the memory cells 12. Likewise, as shown in a right part of the figure, a plurality of bit line pairs 20 each having two complementary bit lines 20a and 20b and a plurality of word lines 21 are provided, while memory cells 22 are individually connected to the intersecting points of the bit line pairs 20 and word lines 21. The right and left bit line pairs 10 and 20 are interconnected via field effect transistors (FETs) 13a, 13b, 23a and 23b. A sense amplifier 30 is made up of two n-channel FETs and connected between a node Na which extends between the FETs 13a and 23a and a node Nb which extends between the FETs 13b and 23b. The FETs 13a and 13b constitute switches each being turned on and off by a gate signal SL which is determined by an address signal. Likewise, the FETs 23a and 23b serve as switches each being turned on and off by a gate signal SR which is determined by an address signal. A sense amplifier enable signal $\overline{S}$ is applied to the sense amplifier 30 for causing it to sense and amplify potentials appearing on the complementary nodes Na and Nb.

The bit line pair 10 on the left-hand side of the figure are connected to a complementary data bus 32 via a pair of transfer gates 31a and 31b. The transfer gates 31a and 31b are each implemented by an n-channel FET which is turned on and off by a column select signal Yi.

The operation of the prior art semiconductor memory shown in FIG. 2 will be described with reference to FIG. 3. The semiconductor memory, or dynamic RAM, of FIG. 2 adopts a shared sense amplifier principle, as stated earlier. To read or write data in the array of memory cells 12 on the left-hand side, the FETs 23a and 23b are disabled by the gate signal SR so as to disconnect the bit line pair 20 on the right-hand side from the sense amplifier 30. Simultaneously, the FETs 13a and 13b are enabled by the gate signal SL to connect the bit line pair 10 on the left-hand side to the sense amplifier 30. Conversely, to read or write data in the array of memory cells 22 on the right-hand side, the FETs 23a and 23b are enabled to cause the bit line pair 20 on the left-hand side into connection with the sense amplifier 30.

How data is read out will be described specifically by taking the case of one of the memory cell 12 of the array located on the left-hand side, with reference to the timing chart of FIG. 3. It is to be noted that all the bit line pairs 10 are precharged to a source voltage Vcc before the start-up.

At a time t1 shown in FIG. 3, the gate signal SR associated with the right memory cell array which is not selected is controlled to reach the bit line potential or source potential Vcc prior to the build-up of a left word line 11. Since the bit line pair 10 has the source level Vcc, the FETs 23a and 23b are turned off so that the left bit line pair 20 is isolated from the sense amplifier 30. The left word line 11 builds up at a time t2 with the result that a signal representative of data is read on the bit line pair 10 out of a memory cell 12 which is associated with the bit line pair 10.

At a time t3, the gate signal SL associated with the memory cell array which is selected is lowered to the source level Vcc. This turns off the FETs 13a and 13b and thereby disconnects the bit line pair 10 from the sense amplifier 30. Consequently, a potential representative of the data stored in the associated memory cell 12 is confined in the node Na or Nb which is associated with the sense amplifier 30. Subsequently, at a time t4, the sense amplifier enable signal $\overline{S}$ is lowered to a low level "L" for thereby causing the sense amplifier 30 to perform a sensing operation. Hence, one node Na, for example, is turned to "L" and the other node Nb is maintained at a high level "H". In this example, therefore, the FETs 13a and 23a are enabled again as soon as the node Na becomes "L", causing a transition of the bit lines 10a and 20a to "L".

At a time t5, the gate signals SL and SR are raised to a predetermined level higher than the source level Vcc. Then, the FETs 13b and 23b are also enabled so that the bit lines 10a and 10b are settled respectively at, in this particular example, "L" and "H". Further, at a time t6, the column select signal Yi is enabled to "H" to in turn enable the transfer gates 31a and 31b. As a result, a signal representative of data on the bit line pair 10 is transferred to the complementary data bus 32 via the transfer gates 31a and 31b, i.e., the data stored in the memory cell 12 is fed out to the outside.

The prior art semiconductor memory constructed as shown and described has various problems left unsolved. Specifically, a VLSI (Very Large Scale Integration) memory or similar memory having a large storage capacity has a great number of bits, resulting in the bit line pairs 10 and 20 which are extremely great in total number. The above-described memory implements the sensing operation by disabling the FETs 13a, 13b, 23a and 23b to isolate the sense amplifier 30 from the bit line pairs 10 and 20 and thereby confining potentials on the nodes Na and Nb, as stated earlier. This kind of scheme is successful in enhancing rapid sensing operations. However, when it comes to a memory having a large capacity and therefore a large bit line capacitance, the prior art memory is apt to fail to transfer data at a high speed within a given memory cell time because it is so constructed as to transfer data read out by the sense amplifier 30 to the complementary bus 32 by way of the bit line pair 10.

Another problem with the prior art semiconductor memory is ascribable to the confinement type sense amplifier 30 which is constituted by n-channel FETs only. Specifically, dropped voltages (Vcc−α) on, among the bit line pairs 10 and 20, the bit lines 10a and 20a or the bit lines 10b and 20b which have the "H" level at the time of sensing remain as they are, obstructing rapid sensing operations.

SUMMARY OF THE INVENTION

It is therefore an object of the present invention to provide a semiconductor memory capable of transferring data at a high speed even if it is provided with an extremely dense configuration.

It is another object of the present invention to provide a semiconductor memory which prevents potentials on those bit lines of bit line pairs which have the "H" level from being substantially lowered.

A semiconductor memory of the present invention comprises a plurality of bit line pairs each comprising a first and a second complementary bit line for transferring data, a plurality of word lines extending across the plurality of bit line pairs, a plurality of memory cells located at the intersecting points of the plurality of bit line pairs and the word lines and connected to the bit line pairs and the word lines for storing data therein, a plurality of sense amplifier circuits each being associated with respective one of the plurality of bit line pairs for selecting potentials on a first and a second node associated with the bit line pair and amplifying the sensed potentials, the plurality of sense amplifier circuits each comprising a first and a second sense amplifier of opposite polarity, a plurality of first FETs each having a source-drain path for connecting to the first node the first bit line of respective one of the plurality of bit line pairs, a plurality of second FETs each having a source-drain path for connecting to the second node the second bit line of respective one of the plurality of bit line pairs. The plurality of first and second field effect transistors individually have commonly connected control electrodes to which a gate signal is applied. The plurality of first and second field effect transistors are complementarily controlled in response to the gate signal to transfer one of the potentials on the first and second bit lines to one of the first and second sense amplifiers.

BRIEF DESCRIPTION OF THE DRAWINGS

The objects and features of the present invention will become more apparent from the consideration of the following detailed description taken with the accompanying drawings in which:

FIG. 4 is a waveform diagram showing the operation of the circuit shown in FIGS. 1A and 1B.

DESCRIPTION OF THE PREFERRED EMBODIMENT

Figure 1A:
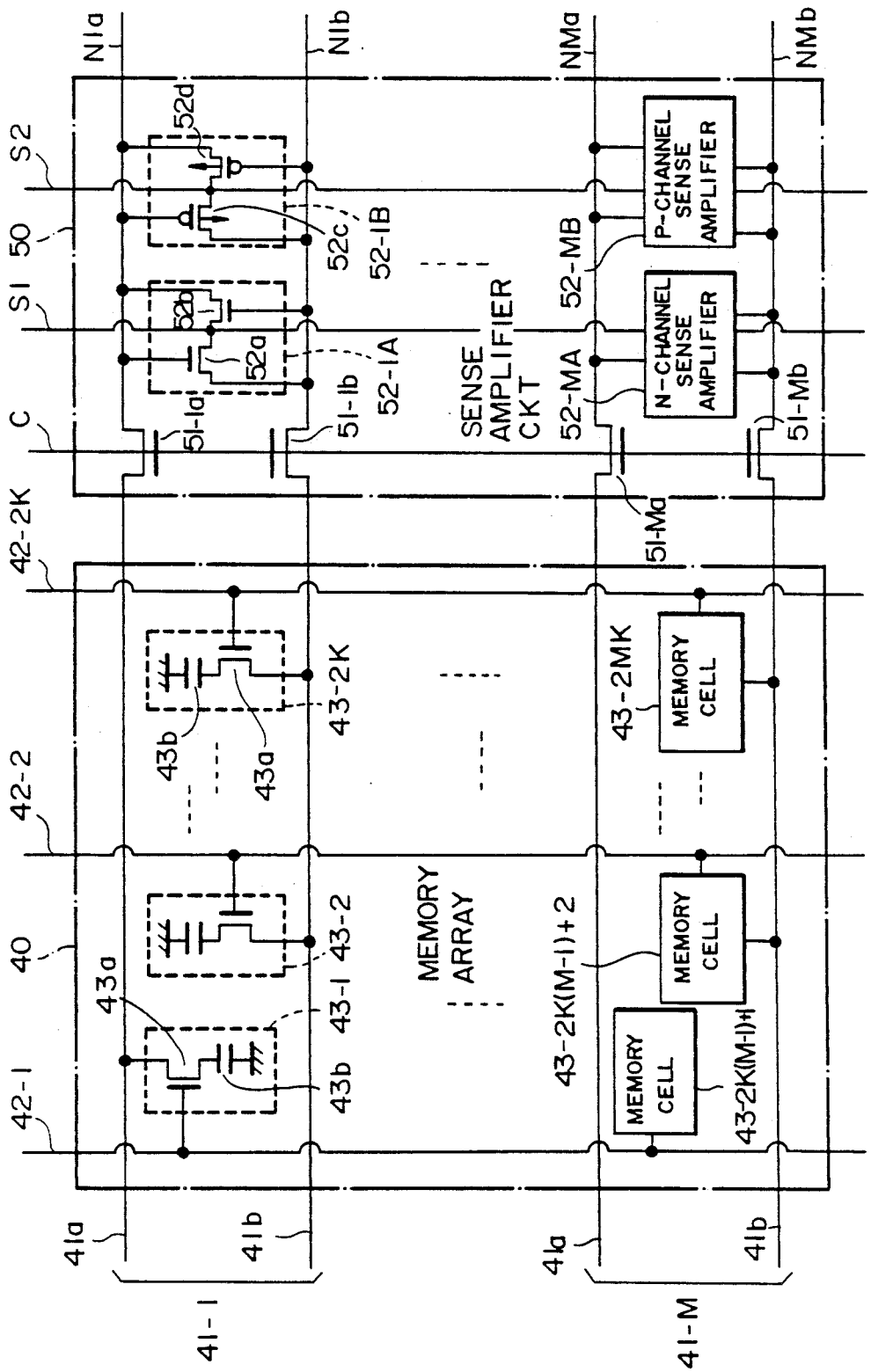
FIGS. 1A and 1B are schematic circuit diagrams showing a semiconductor memory embodying the present invention which is applied to a CMOS dynamic RAM.
Figure 1B:
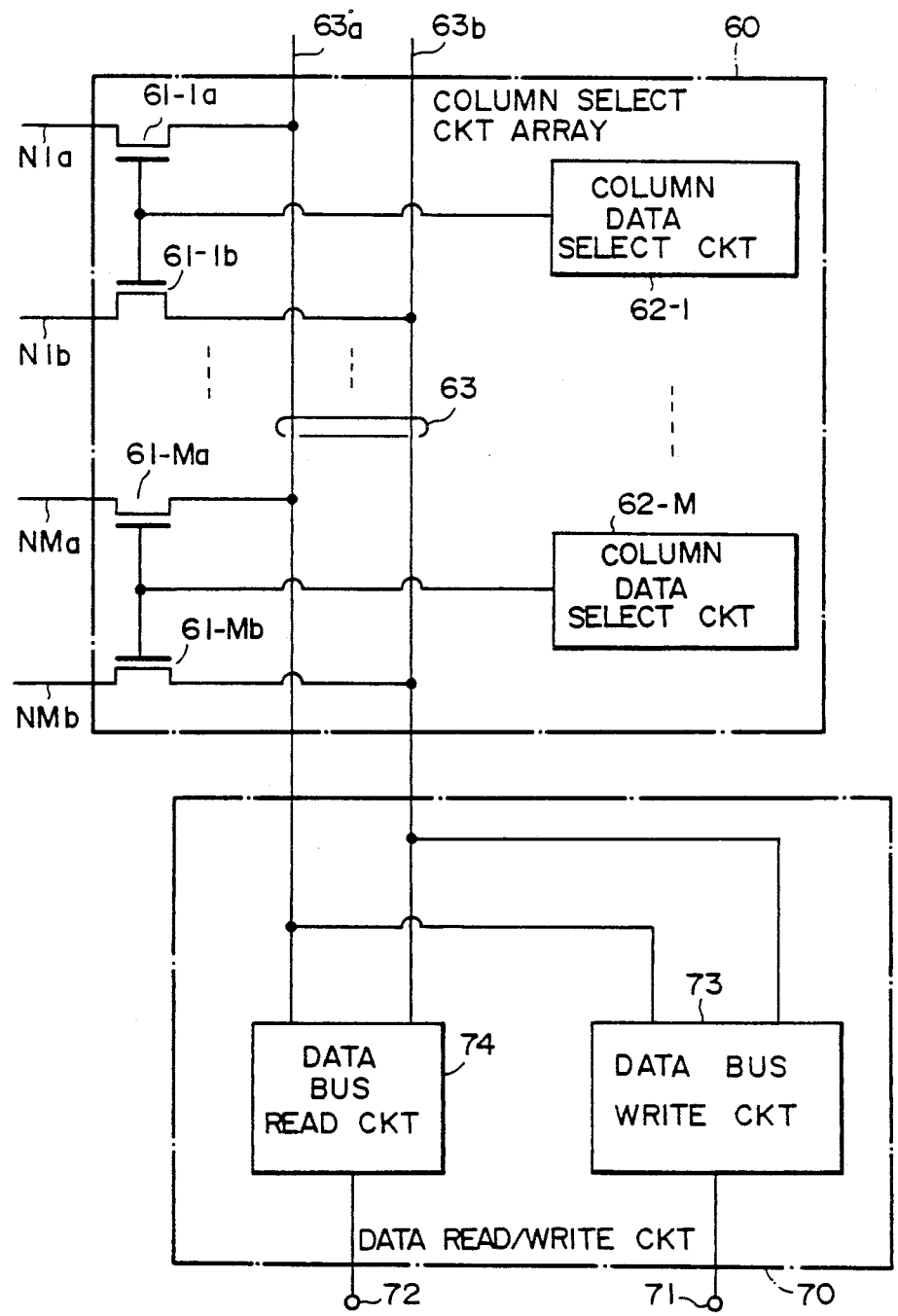
Figure 2:
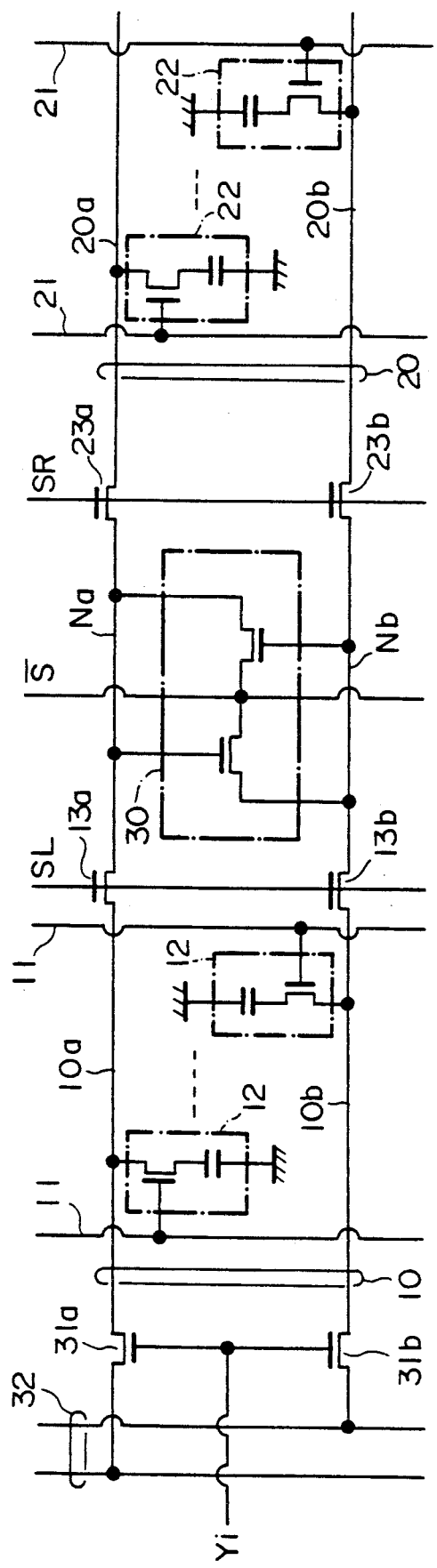
FIG. 2 is a schematic circuit diagram representative of a prior art dynamic RAM implemented by a shared sense amplifier.
Figure 3:
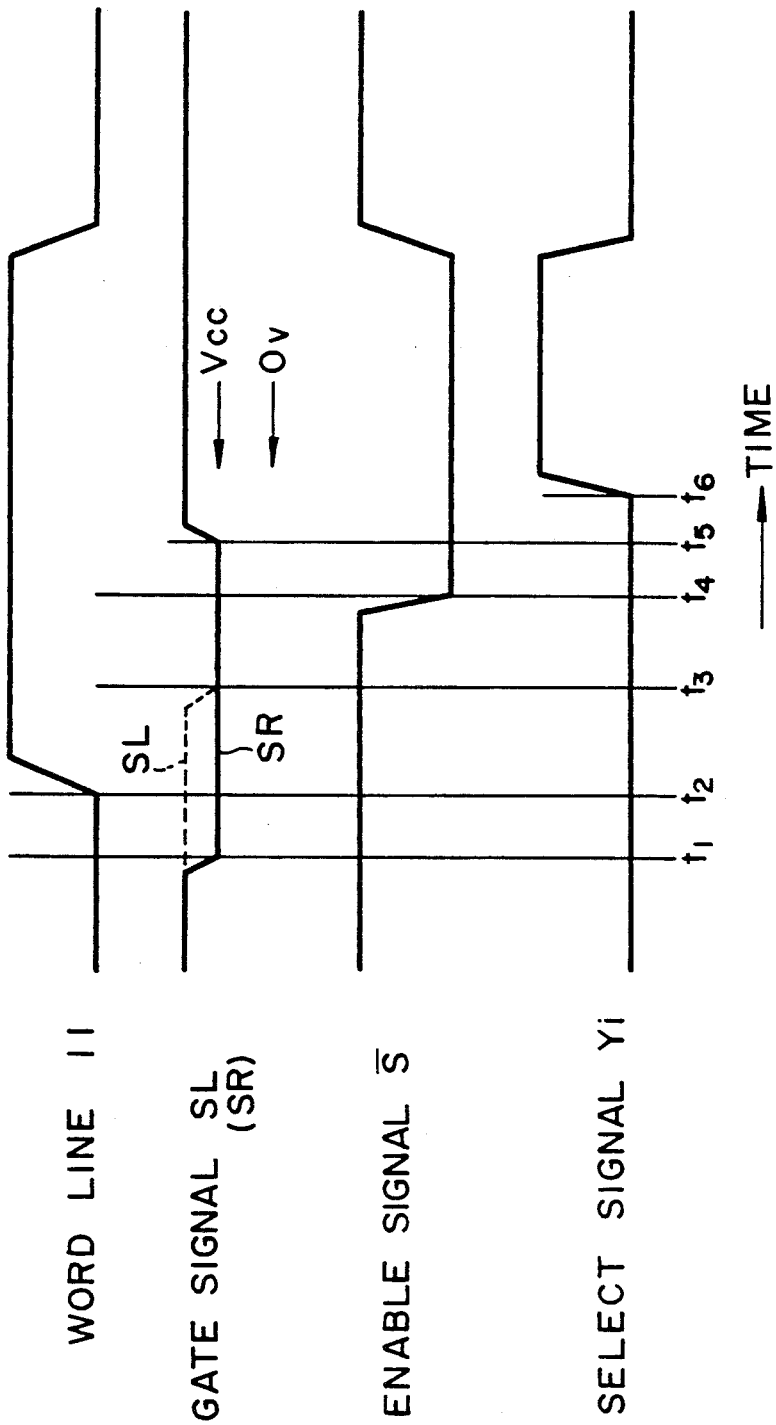
FIG. 3 is a waveform diagram demonstrating the operation of the circuit shown in FIG. 2.

Referring to FIGS. 1A and 1B, a semiconductor memory embodying the present invention is shown and provided with a CMOS dynamic RAM configuration by way of example. The dynamic RAM is constructed by connecting as illustrated a memory array 40 for storing data, a sense amplifier circuit 50 for sensing and amplifying bit line potentials, a column selection circuit array 60 for selecting bit line pairs, and a data bus read/write circuit 70.

The memory array 40 has M (natural number) bit line pairs 41-1, . . . , 41-M each consisting of bit lines 41a and 41b, 2K (K being a natural number) word lines 42-1, . . . , 42-2K, and N (=2M.K) memory cells 43-1, 43-2, . . . , 43-2MK connected to the bit line pairs 41-1, . . . , 41-M and word lines 42-1, . . . , 42-2K as illustrated. Each of the memory cells 43-1, 43-2, . . . , 43-2MK has an n-channel FET 43a adapted for charge transfer and a capacitor 43b adapted for charge storage. The FETs 43a have gate electrodes individually connecting to the word lines 42-1, 42-2, . . . , 42-2K. The FETs 43d also have source or drain electrodes connecting alternately to the bit lines 41a and the bit lines 41b of the bit line pairs 41-1, . . . , 41-M, as shown in FIG. 1A. Further, the drain electrodes or the source electrodes of the FETs 43a are connected to ground via their associated capacitors 43b.

The sense amplifier circuit 50 has M pairs of first and second n-channel FETs 51-1a, 51-1b, . . . , 51-MA, 51-Mb, M n-channel sense amplifiers 52-1A, . . . , 52-Ma, and M p-channel sense amplifiers 52-1B, . . . , 52-MB. The n-channel FETs 51-1a, 51-1b, . . . , 51-Ma, 51-Mb are individually connected to the bit lines 41a and 41b and on-off controlled by a gate signal C. The n-channel sense amplifiers 52-1A, . . . , 52-MA and the p-channel sense amplifiers 52-1B, . . . , 52-MB are individually connected to the n-channel FETs 51-1a, 51-1b, . . . , 51-Ma, 51-Mb via nodes N1a, N1b, . . . , NMa, NMb. Each of the n-channel sense amplifiers 52-1A, . . . , 52-MA has a pair of n-channel FETs 52a and 52b. These FETs 52a and 52b are connected in series in each of paired nodes N1a, N1b, . . . , NMa, NMb which are associated with one diffused electrode of the FETs 51-1a, . . . , 51-Ma and 51-1b, . . . , 51-Mb. The FETs 52a have gate electrodes connecting to the nodes N1a, . . . , NMa while the FETs 52b have gate electrodes connecting to the nodes N1b, . . . , NMb. Further, the junction of each paired FETs 52a and 52b is connected to a sense amplifier enable signal line S1. On the other hand, each of the p-channel sense amplifiers 52-1B, . . . , 52-MB has two p-channel FETs 52c and 52d which are connected in series in each of paired nodes N1a, N1b, . . . , NMa, NMb. The FETs 52c have gate electrodes connecting to the node N1a while the FETs 52d have gate electrodes connecting to the node N1b. The junction of each paired FETs 52c and 52d is connected to a sense amplifier enable signal line S2.

The column selection circuit array 60 includes M pairs of transfer gates 61-1a, 61-1b, . . . , 61-Ma, 61-Mb each being implemented by two n-channel FETs. These paired n-channel FETs are individually connected to the nodes N1a, N1b, . . . , NMa, NMb. M column decoder selection circuits 62-1, . . . , 62-M have gate electrodes which are individually connected to two gate electrodes of the transfer gates 61-1a, 61-1b; . . . ; and 61-Ma, 61-Mb. A complementary data bus 63 has two buses 63a and 63b connecting to the transfer gates 61-1a, 61-1b, . . . , 61-Ma, 61-Mb. The data read/write circuit 70 is made up of an input terminal 71 for inputting write data, an output terminal 72 for outputting read data, a data bus write circuit 73 for transforming write data into complementary data and feeding the latter to the complementary data bus 63, and a data bus read circuit 74 for amplifying a signal appearing on the complementary data bus 73 and applying the amplified signal to the output terminal 72.

The operation of the CMOS dynamic RAM having the above construction will be described in detail with reference to FIG. 4.

To read data out of the memory cell 43-1, for example, the word line 42-1 is enabled. As soon as the potential on the word line 42-1 turns from "L" to "H", the FET 43a of the memory cell 43-1 is turned on resulting in the capacitor 43b being connected to the bit line 41a of the bit line pair 41-1. In the bit line pair 41-1, one of the bit lines such as the bit line 41a (or 41b) is either equal to or slightly higher than a reference potential Vr1 while the other bit line, 41b (or 41a) in this example, is equal to or slightly lower than the reference potential Vr1, depending upon the charge stored in the capacitor 43b. At this instant, the gate signal C has a potential which is high enough to enable the FETs 51-1a and 51-1b. Hence, a signal representative of the data on the bit line pair 41-1 is delivered to the nodes N1a and N1b associated with the n-channel sense amplifier 52-1A and p-channel sense amplifier 52-1B via the FETs 51-1a and 51-1b.

Thereafter, the potential of the gate signal C is controlled to an intermediate potential Vc which is higher than ground potential GND. How the intermediate potential is designed will be described in detail later. The intermediate potential of the gate signal C temporarily disables the FET 51-1a or 51-1b to thereby isolate the bit line pair 41-1 from the node N1a or N1b. When the n-channel sense amplifier 52-1A and p-channel sense amplifier 52-1B are enabled respectively by sense amplifier enable signals S1 and S2, the potentials on the nodes N1a and N1b connected to opposite ends of the sense amplifiers 52-1A and 52-1B are rapidly brought to the full logic levels, i.e. logical ONE and ZERO. Potentials of the sense amplifiers 52-1A and 52-1B and bit line 41a under the above condition are tabulated below.

TABLE

| MEMORY CELL DATA | BIT LINE 41 a or 41 b | SENSE AMPLIFIER 52-1A. 52-1B |
|---|---|---|
| ONE | Vr1 or (vr1 + ΔV) | Vcc |
| ZERO | (Vr1 − ΔV) or Vr1 | GND |

In the above Table, ΔV, Vcc and GND are representative of the output potential from the memory cell 43-1 to the bit line 41-1, power supply potential, and ground potential, respectively.

In the light of this, assuming that the threshold value of the FET 51-1b (or 51-1a) connected to the bit line 41b (or 41a) on which the memory cell data in the above Table is a ZERO is Vth, the previously mentioned intermediate potential Vc of the gate signal C is so predetermined as to satisfy a particular condition:

$$Vth < Vc < Vr1 + Vth$$

Then, the FET 51-1a (or 51-1b) storing the memory cell data ONE will be cut off, while the FET 51-1b (or 51-1a) storing the memory cell data ZERO will be enabled. This causes the bit line 41b (or 41a) associated with the memory cell data ZERO to be coupled to the sense amplifiers 52-1A and 52-1B via the FET 51-1b (or 51-1a) and node N1b (or N1a). Hence, the bit line 41b or (41a) begins to discharge, as represented by a waveform 41b in FIG. 4. The other bit line 41a (or 41b) associated with the memory cell data ONE has been disconnected from the sense amplifiers 52-1A and 52-1B by the disabled FET 51-1a (or 51-1b) and, therefore, its potential is prevented from varying.

When the amplification by the sense amplifiers 52-1A and 52-1B is completed as stated above, i.e., when the nodes N1a and N1b connected to the sense amplifiers 42-1A and 52-1B reach the full logic levels, the column data selection circuit 62-1 is enabled to turn its output from "L" to "H", as shown in FIG. 4. This enables the transfer gates 61-1a and 61-1b and thereby connects the nodes N1a and N1b to the complementary data bus 63. The complementary data bus 63 has two buses 63a and 63b which are precharged to a reference potential Vr2 beforehand. When the transfer gates 61-1a and 61-1b are enabled as mentioned above, the potentials extended from the nodes N1a and N1b are detected and amplified rapidly by the data bus read circuit 74. By this time, the bit line 41b (or 41a) associated with the memory cell data ZERO will have reached a sufficient logic level. The potential of the gate signal C is increased again to a sufficiently high level for enabling the FETs 51-1a and 51-1b. This causes the bit line 41a (or 41b) associated with ONE and having remained at the potential Vr1 or (Vr1+ΔV) to communicate with the node N1a (or N2b) which is in a ONE, thereby charging the bit line 41a to a sufficient logic level of ONE. By the procedure described so far, charging and discharging on the bit lines 41a and 41b are completed.

By the time the charging and discharging is complete, the data bus read circuit 74 fully senses, amplifies and transfers a data signal on the complementary data bus 63. Data, therefore, can be read at a high-speed via the output terminal 72. The sequence of steps for reading data as discussed above is also executed when the memory cells 43-1, . . . , 43-2MK are to be refreshed.

To write data in the memory cell 43-1, for example, the data bus write circuit 73 transforms write data fed via the input terminal 71 into a complementary signal so as to apply a potential associated with the write data to the complementary data bus 63. Then, one column data selection circuit 62-1 associated with the memory cell 43-1 for writing the data is selected and the transfer gates 61-1a and 61-1b associated with the circuit 62-1 are enabled, as during the aforementioned reading operation. When the gate signal C is applied, signals representative of the data on the complementary data bus 63 extend the bit line pair 41-1 via the transfer gates 61-1a, 61-1b, nodes N1a, N1b, and FETs 51-1a and 51-1b which have been enabled. The resulting new potentials on the bit line pair 41-1 are individually fixed to the full logic levels of "H" and "L" by the sense amplifiers 52-1A and 52-1B. If the word line 42-1, for example, has been enabled, the signal representative of the write data will be stored in the memory cell 43-1.

The illustrative embodiment has various unprecedented advantages as enumerated below. It is to be noted that the embodiment shown and described may advantageously be implemented as, among others, a CMOS RAM.

(1) The n-channel sense amplifiers 52-1A, . . . , 52-MA and p-channel sense amplifiers 52-1B, . . . , 52-MB are operated while being substantially fully disconnected from the bit line pairs 41-1, . . . , 41-M, whereby rapid detection and amplification is promoted.

(2) Data of the sense amplifiers 52-1A, 52-1B, ..., 52-MA, 52-MB produced by the above operation (1) are directly transferred to the complementary bus 63 via the transfer gates 61-1a, 61-1b, ..., 61-Ma, 61-Mb. This insures rapid transfer of data to the complementary data bus 63.

(3) Even when the sense amplifiers 52-1A, 52-1B, ..., 52-MA, 52-MB and the complementary data bus 63 are interconnected by the transfer gates 61-1a, 61-1b, ..., 61-Ma, 61-Mb, the bit line 41b (or 41b) continuously discharges. Hence, the read/refresh cycle time is reduced by a significant degree, realizing rapid accesses.

(4) The sense amplifier circuit 50 is made up of the n-channel and p-channel sense amplifiers 52-1A, ..., 52-MA, 52-1B, ..., 52-MB. This eliminates substantial voltage drops (Vcc−ΔV) otherwise brought about on the bit line 41a (or 41b) associated with ONE in the event of sensing and amplification, whereby a rapid sensing operation is achieved. Further, it rarely occurs that the n-channel and p-channel sense amplifiers 52-1A, ..., 52-MA, 52-1B, ..., 52-MB are enabled at the same time. Hence, the DC current is reduced to protect the semiconductor memory from noise and other undesirable occurrences.

In summary, it will be seen that the present invention provides a semiconductor memory which has a sense amplifier implemented by first and second sense amplifiers of opposite polarity and is therefore free from substantial potential drops otherwise caused on "H" portions of bit line pairs in the event of sensing. This allows the whole sense amplifier to operate at a high speed. The first and second sense amplifiers are connected to bit line pairs via first and second FETs. Hence, by enabling the first and second sense amplifiers while substantially fully disconnecting them from the bit line pairs, it is possible to promote rapid sensing operations. This, coupled with the fact that the output of the sense amplifier is directly transferred to a data bus, enhances rapid data transfer. Even when the sense amplifier is held in connection with the data bus, "L" portions of the bit lines can discharge via the first or second FETs and, therefore, the read/refresh time required is reduced.

While the present invention has been described with reference to the particular illustrative embodiment, it it not to be restricted by the embodiment but only by the appended claims. It is to be appreciated that those skilled in the art can change or modify the embodiment without departing from the scope and spirit of the present invention. For example, the n-channel sense amplifiers 52-1A, ..., 52-MA and the p-channel sense amplifiers 52-1B, ..., 52-MB may be replaced with each other. The memory cell array 40, sense amplifier circuit 50, and transfer gates 61-1a, 61-1b, ..., 61-Ma, 62-Mb, for example, may each be configured by using any other type of transistors or may even be implemented as shared sense amplifier circuitry or similar alternative circuit construction. The present invention is applicable not only to a CMOS dynamic RAM shown and described but also to a CMOS static RAM or similar semiconductor memory.

What is claimed is:

1. A semiconductor memory comprising:
   a plurality of bit line pairs each comprising first and second complementary bit lines for transferring data;
   a plurality of word lines extending across said plurality of bit line pairs;
   a plurality of memory cells located at intersections of said bit line pairs and said word lines and coupled thereto for storing data;
   a plurality of first field effect transistors ("FETs"), each having a control electrode to which a gate signal is applied and a source-drain path which interconnects a first node to said first bit line of a respective one of said plurality of bit line pairs, the control electrodes of said first FETs being interconnected in common with each other;
   a plurality of second FETs, each having a control electrode to which the gate signal is applied, the control electrodes of said second FETs being interconnected in common with each other and to the control electrodes of said first FETs, each of said second FET's having a source-drain path which interconnects a second node to said second bit line of a respective one of said plurality of bit line pairs;
   a plurality of sense amplifier circuits each connected across the first and second nodes associated with a respective one of said plurality of bit line pairs for sensing potentials on the first and second nodes and amplifying the sensed potentials thereon, each of said sense amplifier circuit comprising a first and a second sense amplifier of opposite polarity; and
   a plurality of transfer gate means, each connected between a corresponding one of the first and second nodes of a respective sense amplifier circuit and a data bus and operative in response to a signal associated with an address designating one of said plurality of bit line pairs for transferring the amplified potentials on the first and second nodes to the data bus;
   said plurality of first and second FETs being complementarily controlled in response to ·a predetermined potential of the gate signal to connect said first and second bit lines to the first and second nodes, respectively, said predetermined potential being selected between a threshold voltage of said plurality of first and second FETs and a voltage equal to the threshold voltage plus a reference voltage at which said first and second bit lines are precharged prior to application of the gate signal to the control electrodes.

2. A memory in accordance with claim 1, wherein each of said first sense amplifiers comprises a first and a second n-channel field effect transistor having source-drain paths which are connected in series, said source-drain paths each having one end connecting to said first node and another end connecting to said second node, a junction of said source-drain paths of said first and second n-channel field effect transistors which are connected in series being commonly connected throughout said plurality of sense amplifier circuits;
   each of said second sense amplifiers comprising a third and a fourth p-channel field effect transistor having source-drain paths which are connected in series, said source-drain paths each having one end connecting to said first node and another end connecting to said second node, a junction of said source-drain paths of said third and fourth n-channel field effect transistors which are connected in series being commonly connected throughout said plurality of sense amplifier circuits.

3. A memory in accordance with claim 1, wherein each of said plurality of memory cells comprises:
   a third field effect transistor having a source-drain path and a control electrode which is connected to one of said plurality of word lines, said source-drain path having one end connecting to either one of said first and second bit lines; and a capacitor having one electrode connecting to another end of said source-drain path of said third field effect transistor, and another electrode connecting to ground.

4. A memory in accordance with claim 1, wherein said memory constitutes a CMOS dynamic RAM.

5. A memory in accordance with claim 1, wherein each of said plurality of transfer gate means comprises a pair of field effect transistors having an electrode to which the signal associated with an address is applied; said memory further comprising a plurality of column data selection circuits each for generating a signal associated with the address signal and feeding the signal to said control electrode of said pair of field effect transistors of one of said plurality of transfer gate means.

6. A memory in accordance with claim 5, further comprising a data bus read circuit connected to said data bus for delivering data transferred on said data bus to an output port.

7. A memory in accordance with claim 6, further comprising a data bus write circuit connected to said data bus for transferring data applied to an input port to said data bus.

* * * * *